United States Patent [19]
Allardyce et al.

[11] Patent Number: 5,106,454
[45] Date of Patent: Apr. 21, 1992

[54] PROCESS FOR MULTILAYER PRINTED CIRCUIT BOARD MANUFACTURE

[75] Inventors: George R. Allardyce; Anthony J. Davies, both of Nuneaton; David J. Wayness, Brownsover; Amrik Singh, Hillfields, all of United Kingdom

[73] Assignee: Shipley Company Inc., Newton, Mass.

[21] Appl. No.: 607,548

[22] Filed: Nov. 1, 1990

[51] Int. Cl.$^5$ .............................. B44C 1/22; C23F 1/00
[52] U.S. Cl. .................................... 156/629; 156/633; 156/634; 156/656; 156/667; 156/902; 134/3; 252/79.2; 252/79.4
[58] Field of Search .................. 252/79.1, 79.2, 79.3, 252/79.4, 79.5; 156/629, 633, 634, 655, 656, 667, 901, 902; 134/3, 41

[56] References Cited

U.S. PATENT DOCUMENTS

| | | | |
|---|---|---|---|
| 2,094,642 | 10/1937 | Dowling | 156/667 X |
| 2,364,993 | 12/1944 | Meyer | 148/6 |
| 2,932,599 | 4/1960 | Dahlgren | 156/667 X |
| 4,144,118 | 3/1979 | Stahl | 156/667 X |
| 4,409,037 | 10/1983 | Landau | 148/6.14 |
| 4,512,818 | 4/1985 | Valayil et al. | 148/6.14 |
| 4,515,829 | 5/1985 | Deckert et al. | 427/97 |
| 4,540,464 | 9/1985 | Mueller et al. | 156/667 X |
| 4,581,102 | 4/1986 | Brock | 156/667 X |
| 4,642,161 | 2/1987 | Akahoshi et al. | 156/630 |
| 4,643,793 | 2/1987 | Nakaso et al. | 156/306.6 |
| 4,702,793 | 10/1987 | Garlough et al. | 156/629 |
| 4,717,439 | 1/1988 | Hajdu et al. | 156/280 |
| 4,734,299 | 3/1988 | Matuzaki et al. | 427/304 |
| 4,775,444 | 10/1988 | Cordani | 156/634 |
| 4,781,990 | 11/1988 | Grapentin et al. | 428/457 |
| 4,844,981 | 7/1989 | Landau | 428/413 |
| 4,902,551 | 2/1990 | Nakaso et al. | 428/137 |
| 4,997,522 | 3/1991 | Shokoohi | 156/667 X |
| 5,011,569 | 4/1991 | Kihler et al. | 156/667 X |

OTHER PUBLICATIONS

H. Akahoshi, et al., Circuit World, vol. 14, No. 1, pp. 18-21 (1987).
N. Yoshimura, et al., Technical Paper No. B 8/3, Printed Circuit World Convention (Jun. 1990).
P. Goldman, et al., PC Fab, pp. 140-155 (Feb. 1989).
A. Nakaso, et al., PC Fab, pp. 101-106 (Nov. 1989).
Graham, et al., Circuit World, vol. 16, No. 4, pp. 4-12, 1990.

Primary Examiner—William A. Powell
Attorney, Agent, or Firm—Robert L. Goldberg; Peter F. Corless

[57] ABSTRACT

Process for at least partially dissolving a copper oxide surface layer by contacting the surface layer with one or more copper oxide dissolving compounds. When used in the manufacture of a multilayer printed circuit board, the process improves adhesion between board layers, reduces or eliminates localized delamination of a multilayer board that occurs during through-hole drilling, and eliminates or substantially reduces the occurrence of pink ring.

39 Claims, No Drawings

PROCESS FOR MULTILAYER PRINTED CIRCUIT BOARD MANUFACTURE

BACKGROUND OF THE INVENTION

1. Field of the Invention

This invention relates to a process for the manufacture of multilayer printed circuit boards. In particular, the invention relates to reducing or eliminating localized delamination of such a printed circuit board during drilling of through-holes.

2. Description of the Prior Art

Multilayer printed circuit boards are used for a variety of electrical applications and provide notable advantages of conservation of weight and space. A multilayer board is comprised of two or more circuit layers, each circuit layer separated from another by one or more layers of dielectric material. Circuit layers are formed by applying a copper layer onto a polymeric substrate. Printed circuits are then formed on the copper layers by techniques well known in the art, for example print and etch to define and produce the circuit traces.

After lamination, the multiple circuit layers are connected by drilling through-holes through the board surface. Resin smear from through-hole drilling is removed under rather stringent conditions, for example treatment with concentrated sulfuric acid or hot alkaline permanganate, and then the through-holes are further processed and plated to provide a conductive interconnecting surface.

Prior to lamination, the circuit layers are typically treated with an adhesion promoter to improve bond strength between each circuit layer and the interleaving resin layers. One favored method of improving such bond strength is oxidative treatment of a circuit layer to form a copper oxide surface coating thereon.

Persistent problems exist however with the use of a copper oxide adhesion promoter. In particular, leaching of the copper oxide coating occurs laterally along through-hole walls during the through-hole processing and plating steps of board manufacture, a phenomenon known in the art as "pink ring". Once the copper oxide is leached, pinkish copper metal is exposed thus giving rise to the term pink ring. While not necessarily a cause for board rejection in itself, pink ring signals a flaw in the board construction, namely a weak or fractured circuit layer/resin bond.

Such fracturing of board layers traditionally was believed to result from the harsh conditions of through-hole processing steps, for example by direct lateral attack of desmear solutions and electroplating baths. However, more recent views hold that such board delamination occurs earlier in the manufacturing process during through-hole drilling. See, for example, Graham, et al., *Circuit World*, vol. 16, no. 4, pp. 4–12 (1990), incorporated herein by reference. Localized fractures and delamination occur along the oxided inner layer/resin interface from the high mechanical stresses generated during the drilling process. During subsequent through-hole treatment steps, aggressive chemicals seep along these fractures dissolving portions of the copper oxide layer and thereby expose copper metal.

Pink ring has been addressed by forming a conversion coating on a copper oxide surface layer where the conversion coating is resistant to chemical attack during subsequent manufacturing steps. See, for example, U.S. Pat. No. 4,775,444, incorporated herein by reference. This approach, however, does not eliminate pink ring as known conversion coatings are not wholly resistant to attack during later treatment steps. Furthermore, this approach does not address the root cause of pink ring and reason for multilayer board reject, namely fracture of board layers resulting from the stress of through-hole drilling.

Another approach employs reducing agents to reduce the copper oxide surface coating to cuprous oxide or metallic copper. However the reducing agents that are often employed, such as hydrazine or borohydrides, can be expensive as well as toxic, thus posing safety and disposal problems.

SUMMARY OF THE INVENTION

The present invention provides a process comprising the step of contacting a copper oxide surface layer on a copper layer with one or more compounds that will completely or at least partially dissolve the copper oxide surface layer. The copper oxide surface layer on a copper layer may be a two-sided printed circuit board having copper oxidized circuitry thereon. When used in the manufacture of a multilayer printed circuit board, the process of the present invention provides a board that is free or substantially free from pink ring. More particularly, the invention addresses the root cause of pink ring by providing a multilayer board having circuit layer/resin bonds that have a high resistance to fracture during stressful board manufacturing steps such as through-hole drilling. Additionally, the sequential steps of oxidation and dissolution etches the copper board surface enhancing the texture thereof. This more textured surface provides a comparatively strong circuit layer/resin bond which also renders the board resistant to delamination.

The one or more copper oxide dissolving compounds are preferably applied to the copper oxide layer as a solution, preferably an aqueous solution. The copper oxide dissolving compounds may be a wide variety of compounds and include, for example, mineral acids, organic acids, acid salts, alkaline compounds and complexing agents. Many of the copper oxide dissolving compounds are not exceedingly toxic and thus do not pose the safety and disposal problems of some prior systems. A solution of one or more copper oxide dissolving compounds may comprise one or more surfactants to avoid streaking of the copper substrate. An oxidation inhibiting (anti-tarnish) agent may also be incorporated into a copper oxide dissolving solution or applied separately to the copper substrate after at least partially dissolving the copper oxide surface layer. Examples of suitable oxidation inhibiting agents are azoles such as benzotriazole and imidazole.

In another aspect, the invention comprises a process for the manufacture of a multilayer printed circuit board, the process comprising the steps of (a) providing a substrate having a copper circuit pattern thereon, the copper circuit pattern having a surface coating of copper oxide; (b) at least partially dissolving the surface coating of copper oxide with one or more copper oxide dissolving compounds; and (c) laminating together the substrate resulting from step (b) with other layers needed to form the multilayer printed circuit board.

It is a general object of the invention to provide an improved process for the manufacture of multilayer printed circuit boards.

It is another object of the invention to provide a process for reducing delamination of a multilayer printed circuit board.

It is a further object of the invention to provide a process for improving adhesion between the layers of a multilayer printed circuit board.

It is a still further object of the invention to provide a process which eliminates or substantially reduces the occurrence of pink ring on a multilayer printed circuit board.

DESCRIPTION OF THE PREFERRED EMBODIMENTS

The copper oxide surface layer to be treated by the process of the present invention may be formed by a variety of known procedures, for example, those procedures described in U.S. Pat. Nos. 4,512,818 and 2,364,993, both of which are incorporated herein by reference. A preferred oxidant is ProBond 80 (Shipley Company Inc., Newton, Mass.), as used in the manner described herein.

The process of the invention provides at least partially dissolving a copper oxide surface layer on top of a copper layer by contacting the copper oxide surface layer with one or more copper oxide dissolving compounds. Preferably the underlying copper metal is not unduly affected by the one or more copper oxide dissolving compounds. Good results have been achieved when the copper oxide layer is either partially dissolved or completely dissolved. The copper oxide dissolving compounds may be acidic, neutral or basic compounds. More particularly, suitable copper oxide dissolving compounds include mineral acids such as hydrochloric acid, sulfuric acid, phosphoric acid and sulfamic acid; organic acids such as carboxylic acid, acetic acid, trifluoroacetic acid, hydroxyacetic acid, citric acid, tartaric acid, sulfonic acid, methanesulfonic acid, trifluoromethansulfonic acid and phenol sulfonic acid; acid salts such as sodium bisulphate and sodium bifluoride; alkaline compounds such as ammonia and amines; complexing agents such as ethylenediaminetetraacetic acid, N,N,N',N',-Tetrakis (2-hydroxypropyl)ethylene diamine, ammonium chloride, cyano compounds and tartrates. Cyano compounds are less preferred because of their toxicity. The one or more copper oxide dissolving compounds are preferably applied to the copper oxide layer as a solution, preferably as an aqueous solution, although it is clear other solvents could be employed. At least some of the copper oxide dissolving compounds also can be applied in concentrated form without use of a co-solvent. For example, glacial acetic acid could be employed.

A preferred copper oxide dissolving solution is an aqueous solution comprising sulfuric and hydroxyacetic acids, the concentration of sulfuric acid being between about 10 and 200 grams per liter of aqueous solution and the concentration of hydroxyacetic acid being between about 5 and 50 grams per liter of aqueous solution, although broader concentration ranges than these also should be effective. Use of such a sulfuric acid and hydroxyacetic acid solution dissolves a copper oxide surface layer well and provides a uniform copper metal surface. To at least partially dissolve a copper oxide surface layer, the temperature of such a sulfuric acid and hydroxyacetic acid solution is preferably between about 20° C. and 80° C.

The copper oxide dissolving solution may also include one or more surfactants to improve the solution's wettability and thereby reduce streaking of the board's copper surface. A variety of surfactants may be employed including anionic, non-ionic, cationic and amphoteric agents, as are apparent to those skilled in the art. A preferred wetting agent is Triton X100 (Rohm & Haas Co.).

The concentration of the one or more surfactants in the copper oxide dissolving solution is generally between about 100 and 10,000 parts surfactant per million parts of solution, and preferably the surfactant concentration is between about 500 and 5,000 parts surfactant per million parts of solution.

In the case of some copper oxide dissolving compounds, the corresponding copper oxide dissolving solution may include an anti-tarnish agent. For example, addition of an anti-tarnish agent to an aqueous sulfuric acid solution provides a more uniform and tarnish resistant copper substrate surface as well as a copper surface of darker color. In the case of printed circuit boards, this darker color may be preferable to those accustomed to black or brown oxide boards. However, in other solutions, notably citric acid dissolving solutions, addition of an anti-tarnish agent to the dissolving solution has been detrimental, resulting in relatively lower bond strengths. An anti-tarnish agent may alternatively may be applied as a separate step after treatment of the copper substrate with one or more copper oxide dissolving compounds.

After treatment of the copper oxide surface layer with the one or more copper oxide dissolving compounds, the resultant surface is preferably rapidly and uniformly dried, for example hot-air dried.

The process of the invention is advantageously employed in the manufacture of multilayer printed circuit boards, as generally described in U.S. Pat. No. 4,717,439, incorporated herein by reference. Prior to lamination to form a multilayer board, an individual board with copper oxidized circuitry is treated with the one or more copper oxide dissolving compounds as described herein. The length of contact that is necessary to dissolve the copper oxide surface layer can vary widely and depends on various factors such as temperature, degree of agitation and the particular dissolving agent employed. For instance, a copper clad printed circuit board having a surface coating of copper oxide is immersed in a 2% $H_2SO_4$ aqueous solution with temperature of approximately 20° C. for between about 10 seconds and 10 minutes, preferably for about 1 minute. A copper clad printed circuit board having a surface coating of copper oxide is immersed in an aqueous solution comprising about 40 grams of $H_2SO_4$ per liter of solution and about 20 grams of hydroxyacetic acid per liter of solution with solution temperature of approximately 40° C. for between about 10 seconds and 10 minutes, preferably for 1 minute. For solutions comprising weaker acids, longer applications at higher temperatures are generally required to dissolve the copper oxide coating. Thus, a copper oxide coated printed circuit board is immersed for about five minutes in a 1 molar aqueous citric acid solution at approximately 50° C.

Means of contacting a copper oxide coated substrate with the one or more copper oxide dissolving compounds may vary widely and include immersion of the substrate in a copper oxide dissolving solution as well as spraying the substrate with a copper oxide dissolving solution. As speed of dissolution increases with solution agitation, solution contact times are significantly reduced when a spray application is employed.

When used in the manufacture of a multilayer printed circuit board the process of the invention provides good adhesion between board layers. Specifically, for a printed circuit board subjected to the above described process and dissolving compounds, the board's peel strength is significantly greater than the peel strength of an untreated or "scrubbed" copper metal board.

Though not wishing to be bound by theory, it is believed this enhanced adhesion results from an etching of the copper board surface by the sequential steps of oxidizing the copper board surface and then dissolving the oxide layer. Scanning electron microscope ("SEM") examination shows a scrubbed copper board to have a substantially smoother surface than a copper oxide surface or a copper surface from which copper oxide has been dissolved.

It is further believed that a copper surface subjected to the process of the invention has a topography that is more resistant to delamination than a copper oxide board surface. A copper oxide surface is brittle and "spiked" in nature and thus tends to function as a stress raiser to render the copper oxide/resin bond susceptible to fracture by the impact force generated during through-hole drilling. In contrast, SEM examination shows a surface that has been subjected to the process of the invention to be of a cratered or pitted nature and less "spiky" than the surface of a copper oxide layer. This pitted topography is believed to render the board less prone to fracture during through-hole drilling.

This resistance to delamination is evidenced by the elimination of pink ring from multilayer boards having circuit layers that were subjected to the process of the invention. After dissolution or partial dissolution of the copper oxide surface layer, the appearance of the resultant board varies depending on the composition of dissolving solution employed and the amount of the oxide layer that was dissolved. With use of a sulfuric acid/hydroxyacetic acid dissolving solution, the resultant board has a color varying from a dull salmon to a pale brown. During lamination of the board, the board color darkens slightly from what is believed to be oxide growth. Whatever the board color or the amount of darkening that occurs during lamination steps, the invention provides a multilayer printed circuit board that is resistant to delamination as evidenced by the lack of pink ring.

The invention will be better understood by reference to the following examples.

EXAMPLE 1

A preferred aqueous acidic solution in accordance with the invention is as follows:

| Ingredient | Concentration |
| --- | --- |
| Sulfuric acid | 40 gm/l |
| Hydroxyacetic acid | 18 gm/l |
| Water | up to 1 liter |

EXAMPLE 2

A two-sided epoxy printed circuit board having copper surface circuits was sprinkled liberally with Scrub Cleaner 28 (Shipley Company), a pumice material. The board was then scrubbed with a wet brush until the copper surface was visually clean and uniform. The board was then water rinsed and hot-air dried.

EXAMPLE 3

A two-sided epoxy printed circuit board having copper surface circuits was cleaned by immersion in a 10% aqueous solution of Cleaner 742 (Shipley Company) at between 40°–50° C. for approximately 5 minutes. The circuit board was then rinsed for 2 minute periods in two separate water baths. After rinsing, the circuit board was etched in a 60 gm/l aqueous solution of Preposit Etch 748 (Shipley Company) at approximately 20° C. for about 4 minutes. The etched board was then rinsed for 30 second intervals in two separate water baths. After rinsing, the board was immersed for about 1 minute in a 2% Cuposit Z (alkaline solution) (Shipley Company) at a temperature of about 20° C. The board was removed from the Cuposit Z bath and the copper surface was oxidized by immersion of the board for about 9 minutes in a bath of ProBond 80 (Shipley Company) heated to 70° C. The board was then rinsed in 2 separate water baths. After rinsing, the board was immersed for 30 seconds in the aqueous solution of Example 1 at 40° C. and the solution agitated by lateral movement of the board. The board was water rinsed and hot-air dried.

EXAMPLE 4

This Example demonstrates the enhanced adhesion between layers of a multilayer printed circuit board provided by the process of the invention.

A first piece ("Sample 1") of 1 ounce per square foot (35 $\mu$m thick) electrolytic copper foil was scrubbed by the process described in Example 2. A second piece ("Sample 2") of this same electrolytic copper foil was oxidized and then immersed in the copper oxide dissolving solution of Example 1, by the process described in Example 3.

Each of these two copper foil pieces was separately bonded to a rigid dielectric substrate of epoxide resin glass fabric laminate with epoxide resin glass fabric B stage prepeg. The adhesion values of these two copper foil pieces were determined using a pull tester to measure the force required to pull the copper foil piece from the epoxy layer at a 90 degree angle at a rate of 1 inch per minute. The following peel strengths were thus determined:

Sample 1: 1.6 lb./inch
Sample 2: 5.5 lb./inch

EXAMPLE 5

This Example demonstrates the elimination of pink ring from multilayer printed circuit boards subjected to the process of the invention.

A first double-sided copper clad printed circuit board was pretreated and oxidized by the process of Example 3, but the printed circuit board was not immersed in or otherwise subjected to the aqueous solution of Example 1. This copper oxide board was hot-air dried after the final water rinse. A second double-sided copper clad printed circuit board was then subjected to the entire process of Example 3, including immersion of the board in the aqueous copper oxide dissolving solution of Example 1. Each board was then laminated between with three layers of epoxide resin glass fabric B stage prepeg on each board side with 35 $\mu$m copper foil forming the outer layer of the laminate. The laminating conditions were 250 psi at 185° C. for 60 minutes. Multiple holes were then drilled through each laminated board under high chip load conditions, i.e., conditions likely to cause microdelamination. After drilling, the boards were immersed for 60 minutes in a 3 molar hydrochloric acid solution at 20° C., i.e., conditions simulating the aggressive acidic conditions encountered in through-hole manufacturing steps. The boards were then removed from the acidic bath and water rinsed.

After rinsing, each of the two laminated boards was examined for the presence of pink ring on the inner substrate board by grinding away the outer copper foil layer and part of the epoxy prepeg layers, enabling the annulas of the holes at the inner layer to be viewed. For the first board that was not treated with the oxide dissolving solution, microdelamination and leaching of the black oxide had occurred in the areas surrounding the through-holes as evidenced by the copper colored annulas or pink ring around the majority of the through-holes. For the second board treated with the copper oxide dissolving solution of Example 1, the inner layer was a light brown color (such brown color resulting from what was believed to be an oxide growth) that was continuous around all the drilled through-holes and no evidence of pink ring was observed.

The foregoing description of the present invention is merely illustrative thereof, and it is understood that variations and modifications can be effected without departing from the spirit or scope of the invention as set forth in the following claims.

We claim:

1. A process for treating a copper layer having a copper oxide surface layer thereon, comprising the steps of:
   (a) at least partially dissolving the copper oxide surface layer by contacting the surface layer with one or more copper oxide dissolving compounds, and
   (b) laminating the treated copper layer.

2. The process of claim 1 where the one or more copper oxide dissolving compounds is selected from the group consisting of mineral acids, organic acids, acid salts, alkaline compounds, ammonium compounds and complexing agents.

3. The process of claim 1 where the one or more copper oxide dissolving compounds is selected from the group consisting of hydrochloric acid, sulfuric acid, phosphoric acid, sulfamic acid, carboxylic acid, acetic acid, hydroxyacetic acid, trifluoroacetic acid, citric acid, tartaric acid, sulfonic acid, methanesulfonic acid, trifluoromethanesulfonic acid and phenol sulfonic acid.

4. The process of claim 1 where the one or more copper oxide dissolving compounds is selected from the group consisting of sodium bisulfate and sodium bifluoride.

5. The process of claim 1 where the one or more copper oxide dissolving compounds is selected from the group consisting of ethylenediaminetetraacetic acid, N,N,N',N'-Tetrakis(2-hydroxypropyl)ethylene diamine, ammonium chloride, cyano compounds and tartrates.

6. The process of claim 1 where the one or more copper dissolving compounds is sulfuric acid.

7. The process of claim 1 where the copper oxide surface layer is at least partially dissolved by contacting the surface layer with a solution containing one or more copper oxide dissolving compounds.

8. The process of claim 7 where the solution is an aqueous solution.

9. The process of claim 8 where the one or more copper dissolving compounds is sulfuric acid and hydroxyacetic acid.

10. The process of claim 9 where the temperature of the solution is between about 20° C. and 80° C.

11. The process of claim 8 where the solution includes one or more surfactants.

12. The process of claim 7 where the copper oxide surface layer is at least partially dissolved by immersing the copper oxide surface layer in the solution.

13. The process of claim 7 where the copper oxide surface layer is at least partially dissolved by spraying the copper oxide surface layer with the solution.

14. The process of claim 1 where the copper layer is bonded to a dielectric substrate.

15. The process of claim 1 where the copper oxide surface layer is partially dissolved by contacting the surface layer with an aqueous acidic solution.

16. The process of claim 1 where the copper layer is treated with an anti-tarnish agent after at least partially dissolving the copper oxide surface layer.

17. The process of claim 7 where the solution contains an anti-tarnish agent.

18. The process of claims 16 or 17 where the anti-tarnish agent is an azole.

19. A process for the manufacture of a multilayer printed circuit board, the process comprising the steps of:
   (a) providing a substrate having a copper circuit pattern thereon, the copper circuit pattern having a surface coating of copper oxide;
   (b) at least partially dissolving the surface coating of copper oxide by contacting the surface coating with one or more copper oxide dissolving compounds; and
   (c) laminating together the substrate resulting from step (b) with other layers needed to form the multilayer printed circuit board.

20. The process of claim 19 where the surface coating of copper oxide is at least partially dissolved by contacting the surface coating with a solution containing one or more copper oxide dissolving compounds.

21. The process of claim 20 where the solution is an aqueous solution.

22. The process of claim 20 where the solution contains one or more surfactants.

23. The process of claim 19 where the one or more copper oxide dissolving compounds is selected from the group consisting of mineral acids, organic acids, acid salts, alkaline compounds, ammonium compounds and complexing agents.

24. The process of claim 19 where the one or more copper oxide dissolving compounds is selected from the group consisting of hydrochloric acid, sulfuric acid, phosphoric acid, sulfamic acid, carboxylic acid, acetic acid, hydroxyacetic acid, trifluoroacetic acid, citric acid, tartaric acid, sulfonic acid, methanesulfonic acid, trifluoromethanesulfonic acid and phenol sulfonic acid.

25. The process of claim 19 where the one or more copper oxide dissolving compounds is selected from the group consisting of sodium bisulfate and sodium bifluoride.

26. The process of claim 19 where the one or more copper oxide dissolving compounds is selected from the group consisting of ethylenediaminetetraacetic acid, N,N,N',N'-Tetrakis(2-hydroxypropyl)ethylene diamine, ammonium chloride, cyano compounds and tartrates.

27. The process of claim 19 where the one or more copper dissolving compounds is sulfuric acid.

28. The process of claim 21 where the one or more copper dissolving compounds is sulfuric acid and hydroxyacetic acid.

29. The process of claim 1 where the copper oxide layer is completely dissolved by contacting the surface layer with one or more copper oxide dissolving compounds.

30. The process of claim 19 where the surface coating of copper oxide is completely dissolved by contacting the surface coating with one or more copper oxide dissolving compounds.

31. The process of claim 1 where the copper oxide layer is completely dissolved by contacting the surface layer with an acid.

32. The process of claim 1 where the copper oxide layer is completely dissolved by contacting the surface layer with an aqueous acidic solution.

33. The process of claim 19 where the surface coating of copper oxide is completely dissolved by contacting the surface coating with an acid.

34. The process of claim 19 where the surface coating of copper oxide is completely dissolved by contacting the surface coating with an aqueous acidic solution.

35. The process of claim 1 where the copper oxide surface layer is partially dissolved by contacting the surface layer with one or more copper oxide dissolving compounds.

36. The process of claim 1 where the copper oxide surface layer is partially dissolved by contacting the surface layer with an acid.

37. The process of claim 19 where the surface coating of copper oxide is partially dissolved by contacting the surface coating with one or more copper oxide dissolving compounds.

38. The process of claim 19 where the surface coating of copper oxide is partially dissolved by contacting the surface coating with an acid.

39. The process of claim 19 where the surface coating of copper oxide is partially dissolved by contacting the surface coating with an aqueous acidic solution.

* * * * *